(12) United States Patent
Wu et al.

(10) Patent No.: US 9,673,149 B2
(45) Date of Patent: Jun. 6, 2017

(54) SEMICONDUCTOR DEVICE AND MANUFACTURING METHOD THEREOF

(71) Applicants: HannStar Display (Nanjing) Corporation, Nanjing (CN); HANNSTAR DISPLAY CORPORATION, Taipei (TW)

(72) Inventors: Chien-Hao Wu, Taipei (TW); Yi-Ting Lee, Taipei (TW)

(73) Assignees: Hannstar Display (Nanjing) Corporation, Nanjing (CN); Hannstar Display Corporation, Taipei (TW)

( * ) Notice: Subject to any disclaimer, the term of this patent is extended or adjusted under 35 U.S.C. 154(b) by 0 days.

(21) Appl. No.: 14/968,169

(22) Filed: Dec. 14, 2015

(65) Prior Publication Data
US 2016/0204070 A1 Jul. 14, 2016

(30) Foreign Application Priority Data
Jan. 14, 2015 (CN) .......................... 2015 1 0019256

(51) Int. Cl.
| H01L 21/00 | (2006.01) |
|---|---|
| H01L 23/544 | (2006.01) |
| H01L 29/66 | (2006.01) |
| H01L 27/12 | (2006.01) |
| H01L 21/441 | (2006.01) |
| H01L 29/24 | (2006.01) |
| H01L 29/786 | (2006.01) |

(52) U.S. Cl.
CPC .......... *H01L 23/544* (2013.01); *H01L 21/441* (2013.01); *H01L 27/1225* (2013.01); *H01L 27/1262* (2013.01); *H01L 29/24* (2013.01); *H01L 29/66969* (2013.01); *H01L 29/7869* (2013.01); *H01L 2223/5442* (2013.01); *H01L 2223/54426* (2013.01); *H01L 2223/54486* (2013.01); *H01L 2924/0002* (2013.01)

(58) Field of Classification Search
None
See application file for complete search history.

(56) References Cited

U.S. PATENT DOCUMENTS

| 2002/0075442 A1* | 6/2002 | Yanagawa | G02F 1/1333 349/155 |
|---|---|---|---|
| 2003/0146475 A1* | 8/2003 | Lai | G03F 7/70633 257/359 |
| 2003/0201440 A1* | 10/2003 | Satou | B23K 26/04 257/59 |
| 2006/0027809 A1* | 2/2006 | Ogawa | H01L 21/268 257/66 |

(Continued)

*Primary Examiner* — David E Graybill
(74) *Attorney, Agent, or Firm* — Muncy, Geissler, Olds & Lowe, P.C.

(57) ABSTRACT

A method for manufacturing a semiconductor device is provided. The method comprises the steps of: providing a transparent substrate having a visible region and an invisible region; forming a gate and at least an alignment mark coplanarly on the transparent substrate, wherein the gate is located in the visible region and the alignment mark is located in the invisible region; forming a gate insulation layer to cover the gate and cover the alignment mark; forming an oxide semiconductor layer on the gate insulation layer above the gate; and forming an etching stop layer above the gate and the alignment mark.

16 Claims, 9 Drawing Sheets

(56) References Cited

U.S. PATENT DOCUMENTS

| | | | | |
|---|---|---|---|---|
| 2006/0049408 A1* | 3/2006 | Sohn | ................ | G02F 1/1333 257/72 |
| 2013/0321719 A1* | 12/2013 | Sumida | ................ | G02F 1/1333 349/12 |
| 2015/0185530 A1* | 7/2015 | Fu | ................ | G02F 1/1336 349/48 |

* cited by examiner

SEMICONDUCTOR DEVICE AND MANUFACTURING METHOD THEREOF

CROSS REFERENCE TO RELATED APPLICATIONS

This Non-provisional application claims priority under 35 U.S.C. §119(a) on Patent Application No(s). 201510019256.1 filed in People's Republic of China on Jan. 14, 2015, the entire contents of which are hereby incorporated by reference.

BACKGROUND OF THE INVENTION

Field of Invention

Embodiments described herein relate generally to a semiconductor device and a manufacturing method thereof.

Related Art

A photo engraving process (PEP) is often applied to the process of manufacturing semiconductor. One photo engraving process generally comprises deposition, development, etching, and so on. A gate, a drain, a source, a channel, an etching stop layer, a passivation layer, a pixel electrode, or the like are generally formed by the photo engraving process in a process of manufacturing thin film transistor (TFT) substrate. However, the manufacturing process is complex and the issue of alignment tolerance is also difficult to be solved.

Generally, during the first photo engraving process, an alignment mark is disposed in an non-display region on a substrate at the same time (e.g. the alignment mark is formed while a gate is formed) so the photo mask can precisely form the required stack structure by aligning the alignment mark in the following photo engraving processes. However, after repeated etching steps, the alignment mark is easily etched away due to the excessively thin membrane of stack in the non-display region. Thus, the alignment can't be successfully retained in the following photo engraving processes.

Therefore, what is needed is to provide a semiconductor device and a manufacturing method thereof which can protect the alignment mark from etching for the alignment in the following processes.

SUMMARY OF THE INVENTION

An aspect of the disclosure is to provide a semiconductor device and a manufacturing method thereof which can prevent the alignment mark from etching in the following processes.

A method for manufacturing a semiconductor device according to the disclosure comprises the steps of: providing a transparent substrate having a display region and an non-display region; forming a gate and at least an alignment mark coplanarly on the transparent substrate, wherein the gate is located in the display region and the alignment mark is located in the non-display region; forming a gate insulation layer to cover the gate and cover the alignment mark; forming an oxide semiconductor layer on the gate insulation layer above the gate; and forming an etching stop layer above the gate and the alignment mark.

A method for manufacturing a semiconductor device according to the disclosure comprises the steps of: providing a transparent substrate having a display region and an non-display region; forming a gate and at least an alignment mark coplanarly on the transparent substrate, wherein the gate is located in the display region and the alignment mark is located in the non-display region; forming a gate insulation layer to cover the gate and cover the alignment mark; and forming an oxide semiconductor layer on the gate insulation layer above the gate and the alignment mark.

In one embodiment, the method further comprises a step of forming an etching stop layer on the oxide semiconductor layer above the gate and the alignment mark.

In one embodiment, the step of forming the etching stop layer comprises: forming a to-be-etched layer to cover the gate and cover the alignment mark; forming a photoresist layer on the to-be-etched layer above the gate and the alignment mark; and removing the portion of the to-be-etched layer which is not shielded by the photoresist layer, and the remaining portion of the to-be-etched layer which is shielded by the photoresist layer is serving as a shield to form the etching stop layer.

In one embodiment, the method further comprises a step of forming a buffer layer on the oxide semiconductor layer above the gate and the alignment mark.

In one embodiment, the method further comprises the steps of: forming a source/drain; forming a protective layer to cover at least a part of the source/drain; and forming a conductive layer to be electrically connected to the source/drain.

In one embodiment, the protective layer extends to cover the alignment mark in the step of forming the protective layer.

A semiconductor device according to the disclosure comprises a transparent substrate, a gate, at least an alignment mark, a gate insulation layer, an oxide semiconductor layer, and an etching stop layer. The transparent substrate has a display region and an non-display region. The gate is formed on the transparent substrate and located in the display region. The alignment mark is formed on the transparent substrate and coplanar with the gate in the non-display region. The gate insulation layer covers the gate and the alignment mark. The oxide semiconductor layer is formed on the gate insulation layer above the gate. The etching stop layer is formed above the gate and the alignment mark.

A semiconductor device according to the disclosure comprises a transparent substrate, a gate, at least an alignment mark, a gate insulation layer, and an oxide semiconductor layer. The transparent substrate has a display region and an non-display region. The gate is formed on the transparent substrate and located in the display region. The alignment mark is formed on the transparent substrate and coplanar with the gate in the non-display region. The gate insulation layer covers the gate and the alignment mark. The oxide semiconductor layer is formed on the gate insulation layer above the gate and the alignment mark.

In one embodiment, the semiconductor device further comprises an etching stop layer formed on the oxide semiconductor layer above the gate and the alignment mark.

In one embodiment, the semiconductor device further comprises a protective layer covering the alignment mark.

In one embodiment, the semiconductor device further comprises a buffer layer formed on the oxide semiconductor layer above the gate and the alignment mark.

In one embodiment, the material of the gate insulation layer comprises silicon oxide, silicon nitride, silicon oxynitride, or polyimide (PI).

In one embodiment, the material of the oxide semiconductor layer comprises indium gallium zinc oxide (IGZO) or amorphous silicon (a-Si).

In one embodiment, the material of the conductive layer comprises indium tin oxide (ITO), indium zinc oxide (IZO), aluminum doped zinc oxide (AZO), fluorine doped tin oxide (FTO), gallium doped zinc oxide (GZO), or a combination thereof.

In summary, the semiconductor device and its manufacturing method according to the disclosure are to form the etching stop layer or the oxide semiconductor layer on the alignment mark. Therefore, the alignment mark will not be removed due to the etching process and alignment functionality can be retained in the following manufacturing processes.

BRIEF DESCRIPTION OF THE DRAWINGS

Aspects of the present disclosure will become more fully understood from the detailed description and accompanying drawings. However, it is also emphasized that the drawings appended illustrate only typical embodiments of this invention and are therefore not to be considered limiting in scope, for the invention may apply equally well to other embodiments.

DETAILED DESCRIPTION OF THE INVENTION

Figure 1A:
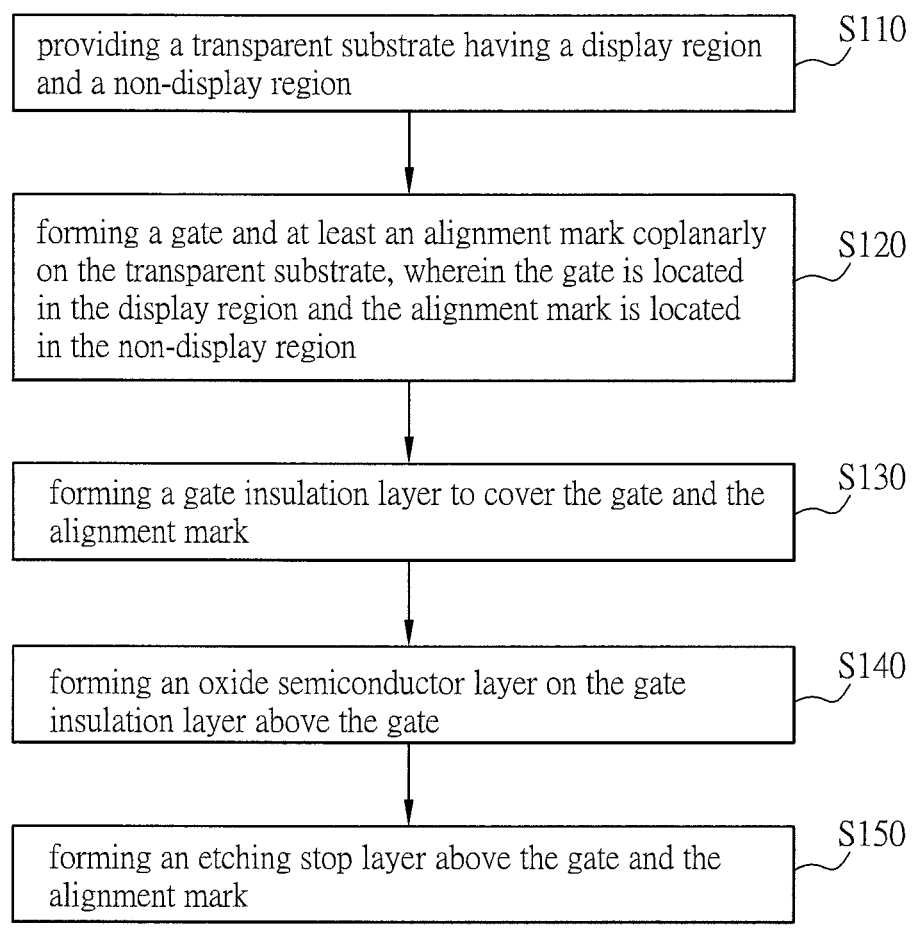
FIG. 1A is a flow chart of the steps of the method for manufacturing a semiconductor device according to the first embodiment.

The embodiments of the invention will be apparent from the following detailed description, which proceeds with reference to the accompanying drawings, wherein the same references relate to the same elements. It is to be understood that the following disclosure provides different embodiments, or examples, for implementing different features of the invention. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not itself dictate a relationship between various embodiments and/or configurations discussed.

Figure 1B:
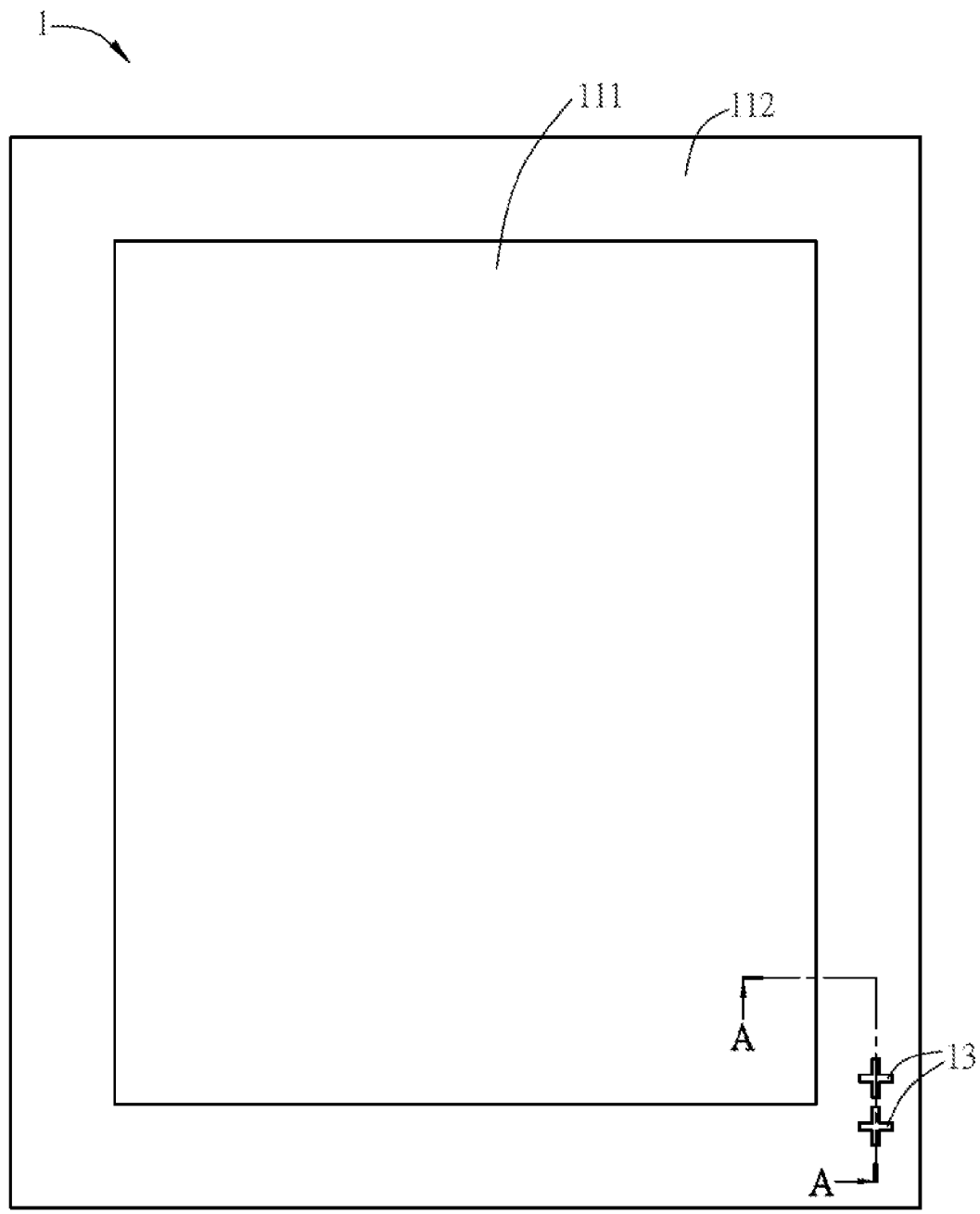
FIG. 1B is a top view of the semiconductor device according to the first embodiment.
Figure 1C:
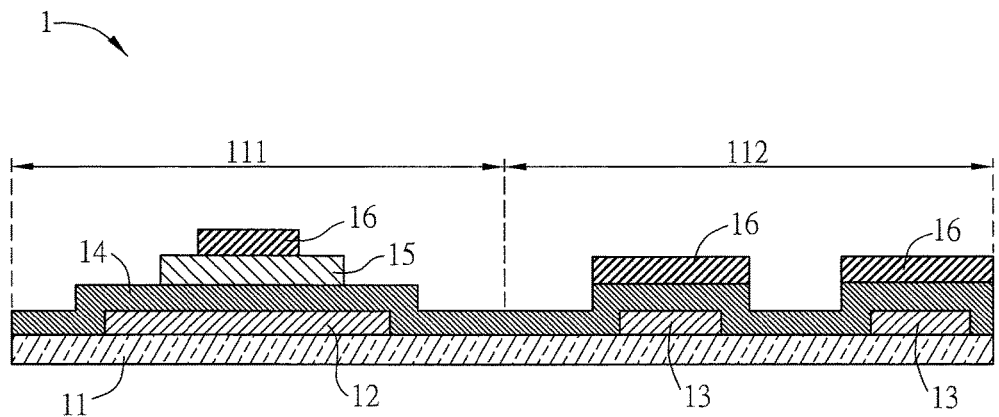
FIG. 1C is a sectional schematic diagram along the line A-A of FIG. 1B.

FIG. 1A is a flow chart of the steps of the method for manufacturing a semiconductor device according to the first embodiment. FIG. 1B is a top view of the semiconductor device according to the first embodiment. FIG. 1C is a sectional schematic diagram along the line A-A of FIG. 1B. Referring to FIG. 1A, FIG. 1B and FIG. 1C, the semiconductor device 1 may be a thin film transistor (TFT) substrate, a display panel, a touch panel, a touch display panel, or an electronic device using this semiconductor device. A TFT substrate is taken for example in this embodiment.

The method for manufacturing the semiconductor device 1 according to the embodiment comprises the steps of: providing a transparent substrate having a display region and an non-display region (S110); forming a gate and at least an alignment mark coplanarly on the transparent substrate, wherein the gate is located in the display region and the alignment mark is located in the non-display region (S120); forming a gate insulation layer to cover the gate and cover the alignment mark (S130); forming an oxide semiconductor layer on the gate insulation layer above the gate (S140); and forming an etching stop layer above the gate and the alignment mark (S150). In this embodiment, the semiconductor device 1 comprises a transparent substrate 11, a gate 12, at least an alignment mark 13, a gate insulation layer 14, an oxide semiconductor layer 15, and an etching stop layer 16.

In the step S110, the transparent substrate 11 has a display region 111 and an non-display region 112. The display region 111 is a region that the display panel outputs an image, and the non-display region 112 is a region not displaying an image. The transparent substrate 11 may be a glass substrate, a plastic substrate, a polymer substrate, or a sapphire substrate. The glass substrate is taken for example in this embodiment. The non-display region 112 is located in the periphery of the display region 111, namely located in at least one side of the display region 111. In this embodiment, the display region 111 is surrounded by the non-display region 112 for example.

In the step S120, the gate 12 is formed on the transparent substrate 11 and located in the region 111. For example, a metal layer may be deposited on the transparent substrate 11 by sputtering, printing, or the like, and the metal layer is covered with a photoresist. Then, exposure, development, etching, and other processes are performed on the photoresist by using a photo mask to form the the gate 12. The material of the gate 12 may comprise tantalum (Ta), neodymium (Nd), chromium (Cr), tungsten (W), titanium (Ti), molybdenum (Mo), aluminum (Al), copper (Cu), or their combination.

Moreover, the alignment mark 13 and the gate 12 are formed coplanarly on the transparent substrate 11, and the alignment mark 13 is located in the non-display region 112. The disposition of the alignment mark 13 contributes to the alignment of the photo mask in the following photo engraving process (PEP) of the semiconductor device 1. Accordingly, the stack structure can precisely be formed on the transparent substrate 11 by the photo mask to reduce the tolerance of the manufacturing process. In the embodiment, the alignment mark 13 and the gate 12 use the same material, and they are formed on the the transparent substrate 11 by the same manufacturing process simultaneously. Furthermore, the shape of the alignment mark 13 is not limited and may be a cross, triangle, square, round shape, ellipse, or other geometric shapes. This embodiment is illustrated by taking two cross-shaped alignment marks 13 for example.

In the step S130, the gate insulation layer 14 covers the gate 12 and the alignment marks 13. For example, the gate insulation layer 14 may be formed on the transparent substrate 11 by chemical vapor deposition (CVD) and cover the gate 12 and the alignment marks 13. Moreover, the material of the gate insulation layer 14 may comprise silicon oxide ($SiO_x$), silicon nitride ($SiN_x$), silicon oxynitride ($SiO_xN_y$), aluminum oxide ($Al_2O_3$), aluminum nitride ($AlN_x$), or polyimide (PI).

In the step S140, the oxide semiconductor layer 15 is formed on the gate insulation layer 14 above the gate 12. In detail, the oxide semiconductor layer 15 may comprise indium gallium zinc oxide (IGZO). A layer of indium gallium zinc oxide (IGZO) may be deposited on the gate insulation layer 14 by sputtering, coating, or the like, and the indium gallium zinc oxide (IGZO) is covered by a photoresist. Then, exposure, development, etching, and other processes are performed on the photoresist by using a photo mask to form an indium gallium zinc oxide (IGZO) layer (namely the oxide semiconductor layer 15). Here, the oxide semiconductor layer 15 may serve as a channel region of the transistor.

In the step S150, the etching stop layer 16 is formed above the gate 12 and the alignment marks 13. Referring to FIG. 1A, FIG. 1C, and FIGS. 2A to 2D, FIG. 2A is a flow chart of the steps of forming the etching stop layer, and FIGS. 2B to 2D are schematic diagrams showing the manufacturing process of the etching stop layer. In the embodiment, the etching stop layer 16 is formed by the following steps of: forming a to-be-etched layer EL to cover the gate 12 and cover the alignment marks 13 (step S151 as shown in FIG. 2B); forming a photoresist layer PR on the to-be-etched layer EL above the gate 12 and the alignment marks 13 (step S152 as shown in FIG. 2C); and removing the portion of the to-be-etched layer EL which is not shielded by the photoresist layer PR, and the remaining portion of the to-be-etched layer EL which is shielded by the photoresist layer PR is serving as a shield to form the etching stop layer 16 (step S153 as shown in FIG. 2D). In the step S153, the portion of the to-be-etched layer EL which is not shielded by the photoresist layer PR is removed by dry etching, and the portion of the to-be-etched layer EL which is shielded by the photoresist layer PR is the etching stop layer 16. Hence, the disposition of the etching stop layer 16 above the gate 12 contributes to the following formation of the source/drain. Finally, the step S154 is to remove the photoresist layer PR (as shown in FIG. 1C). However, in some embodiments, the photoresist layer PR may be retained but not removed. Therefore, the step S154 may be omitted.

While the etching stop layer 16 is formed, the photoresist layer PR is formed above the gate 12 and the alignment marks 13 simultaneously. Accordingly, the to-be-etched layer EL above the alignment marks 13 can be retained to form the etching stop layer 16 during dry etching. As a result, the gate insulation layer 14 and the etching stop layer 16 have the stack structure which can serve as protection for the alignment marks 13. Therefore, the alignment marks 13 will not be removed due to the etching process, and alignment can be retained in the following manufacturing process of the source/drain.

Figure 3A:
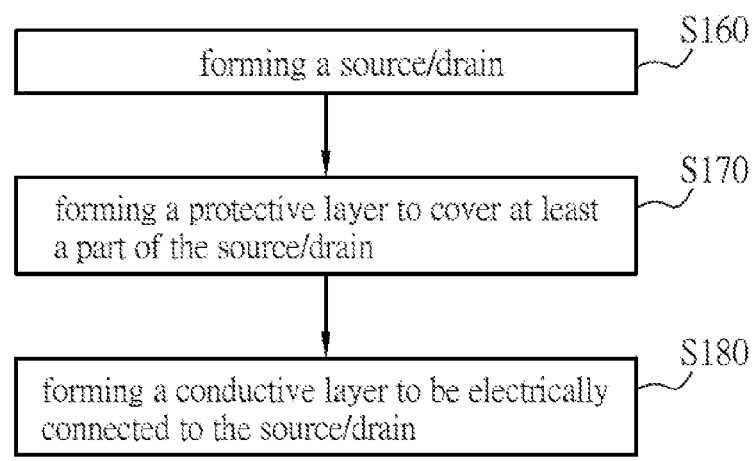
FIG. 3A is a flow chart of the steps of forming the source/drain of the semiconductor device.
Figure 3B:
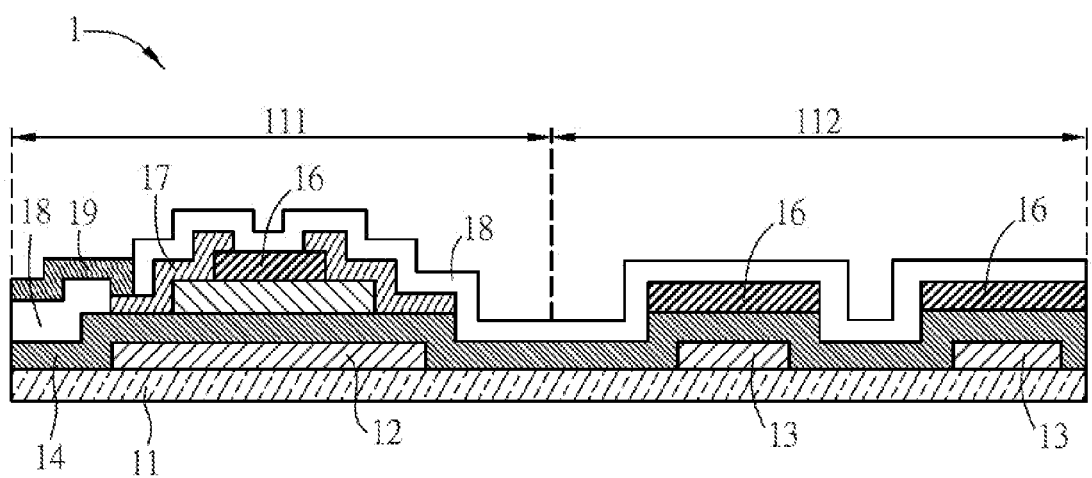
FIG. 3B is a sectional schematic diagram showing the semiconductor device provided with the source/drain according to the first embodiment.

FIG. 3A is a flow chart of the steps of forming the source/drain of the semiconductor device, and FIG. 3B is a sectional schematic diagram showing the semiconductor device provided with the source/drain according to the first embodiment. As shown in FIG. 3A and FIG. 3B, in the following manufacturing processes, the method may further comprise the steps of: forming a source/drain (S160); forming a protective layer to cover at least a part of the source/drain (S170); and forming a conductive layer to be electrically connected to the source/drain (S180). In this embodiment, the semiconductor device 1 further comprises a source/drain 17, a protective layer 18, and a conductive layer 19.

In the step S160, the source/drain 17 is formed on the gate insulation layer 14 and connected to the oxide semiconductor layer 15. Thus, a transistor is formed by the gate 12, the oxide semiconductor layer 15, and the source/drain 17.

In the step S170, the material of the protective layer 18 is an insulation material which may comprise silicon oxide, silicon nitride, silicon oxynitride, or polyimide (PI) to avoid the electrical influence due to the source/drain 17 in contact with an external conductor. In the embodiment, the protective layer 18 has an opening communicating with the source/drain 17. Moreover in the step S180, the conductive layer 19 is electrically connected to the source/drain 17 via this opening.

In the embodiment, the conductive layer 19 is a pixel electrode. Its material may comprise indium tin oxide (ITO), indium zinc oxide (IZO), aluminum doped zinc oxide (AZO), fluorine doped tin oxide (FTO), gallium doped zinc oxide (GZO), or a combination thereof.

Moreover, in the embodiment, the protective layer 18 extends to cover the alignment marks 13. In other embodiments, the protective layer 18 may be only formed in the display region 111 but not cover the alignment marks 13.

Figure 4:
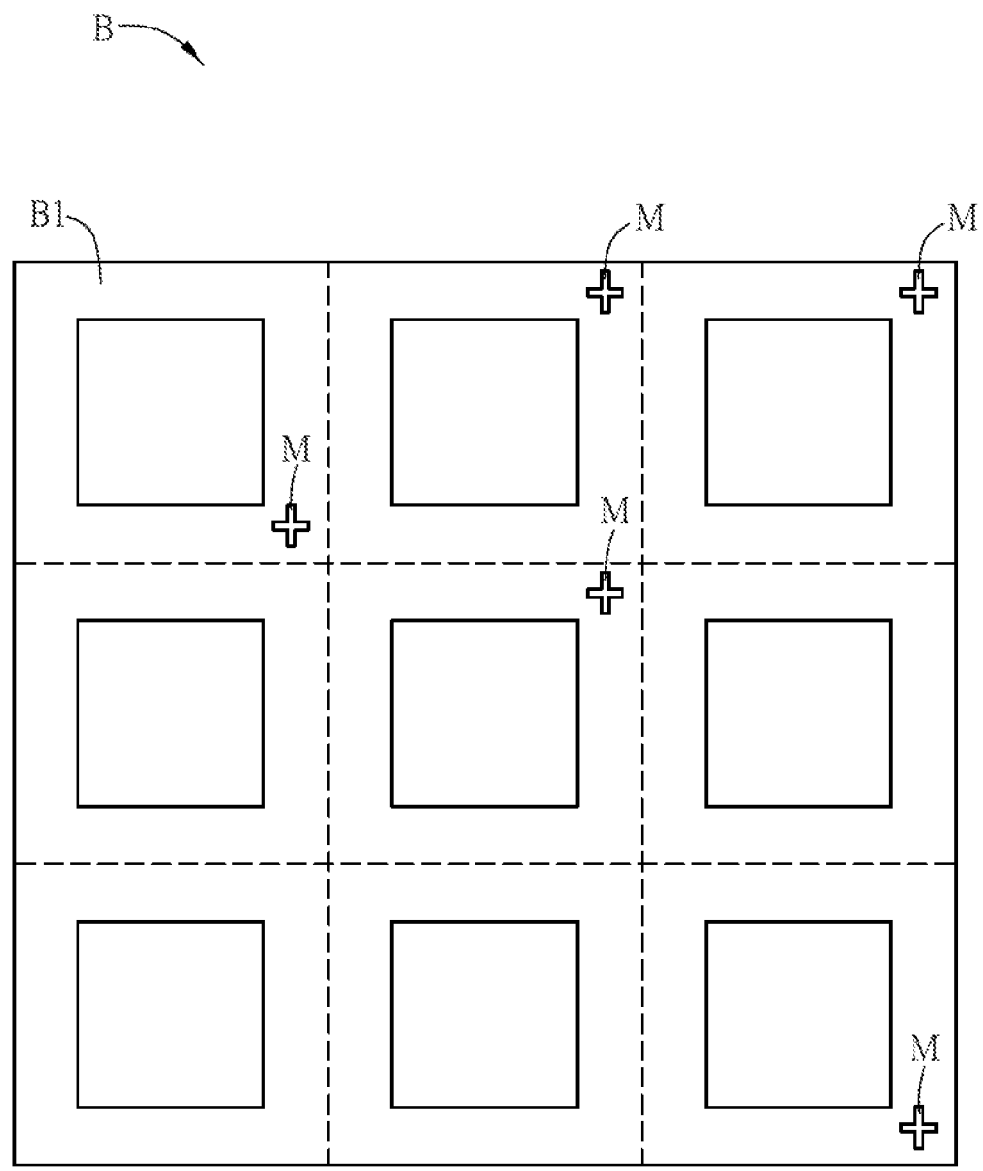
FIG. 4 is a top view of the base material of the semiconductor device.

FIG. 4 is a top view of the base material of the semiconductor device. Referring to FIG. 4, the implementation of manufacturing the above-mentioned semiconductor device 1 is to arrange numerous semiconductor devices 1 on one base material B. In short, numerous semiconductor devices 1 are manufactured simultaneously and then divided into numerous semiconductor devices 1 by cutting. For example, 9 semiconductor devices 1 are obtained by cutting along the dotted lines as shown in FIG. 4. One or more alignment marks M may also be disposed in the non-display region B1 on the base material B to facilitate the alignment of the photo engraving process. The stack structure on the the alignment marks M may refer to the above embodiment.

Figure 5A:
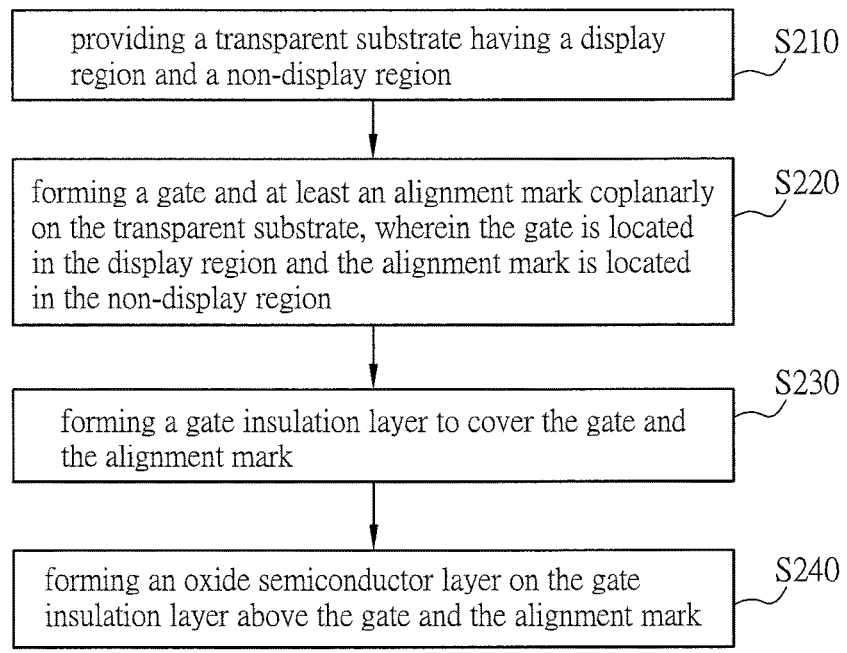
FIG. 5A is a flow chart of the steps of the method for manufacturing the semiconductor device according to the second embodiment.
Figure 5B:
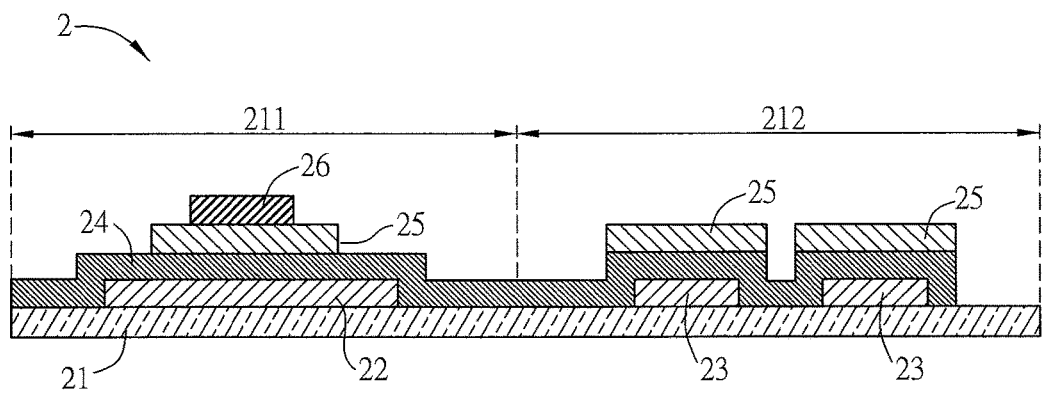
FIG. 5B is a sectional schematic diagram showing the semiconductor device according to the second embodiment.

FIG. 5A is a flow chart of the steps of the method for manufacturing the semiconductor device according to the second embodiment, and FIG. 5B is a sectional schematic diagram showing the semiconductor device according to the second embodiment. Referring to FIG. 5A and FIG. 5B, in this embodiment the method comprises the steps of: providing a transparent substrate having a display region and an non-display region (S210); forming a gate and at least an alignment mark coplanarly on the transparent substrate, wherein the gate is located in the display region and the alignment mark is located in the non-display region (S220); forming a gate insulation layer to cover the gate and cover the alignment mark (S230); and forming an oxide semiconductor layer on the gate insulation layer above the gate and the alignment mark (S240). In the embodiment, the semiconductor device 2 comprises a transparent substrate 21, a gate 22, at least an alignment mark 23, a gate insulation layer 24, and an oxide semiconductor layer 25.

Similarly, the transparent substrate 21 has a display region 211 and an non-display region 212 (step S210); the gate 22 is formed on the transparent substrate 21 and located in the display region 211, the alignment marks 23 and the gate 22 are formed coplanarly on the transparent substrate 21, and the alignment marks 23 are located in the non-display region 212 (step S220); the gate insulation layer 24 covers the gate 22 and the alignment marks 23 (step S230). The connections and descriptions of the above components in this embodiment may refer to the first embodiment. In this embodiment, the oxide semiconductor layer 25 is formed on the gate insulation layer 24 above the gate 22 and the alignment marks 23 (step S240).

In detail, in the step S240, the oxide semiconductor layer 25 may similarly comprise indium gallium zinc oxide (IGZO). A layer of indium gallium zinc oxide (IGZO) may be deposited on the gate insulation layer 24 by sputtering, coating, or the like, and the indium gallium zinc oxide (IGZO) is covered with a photoresist. Then, exposure, development, etching, and other processes are performed on the photoresist by using a photo mask to form an indium gallium zinc oxide (IGZO) layer (namely the oxide semiconductor layer 25). Here, the oxide semiconductor layer 25 according to the embodiment are formed above not only the gate 22 but the alignment marks 23. As a result, the gate insulation layer 24 and the oxide semiconductor layer 25 have the stack structure which can serve as protection for the alignment marks 23. Therefore, the alignment marks 23 will not be removed due to the etching process, and alignment can be retained in the following manufacturing process of the source/drain.

Moreover, in some embodiments, the shape of the oxide semiconductor layer 25 above the alignment marks 23 may match the shape of the alignment marks 23. For example, they may be crosses, triangles, squares, round shapes, ellipses, or other geometric shapes in the same shape and size to facilitate their utilities of alignment in the following manufacturing process.

The semiconductor device 2 may further comprise an etching stop layer which is formed above the gate 22, and then the following manufacturing process of the source/drain may be performed to form the transistor and the pixel electrode. In some embodiments, the semiconductor device 2 further comprises a source/drain, a protective layer, and a conductive layer through the manufacturing process of the source/drain. Here, the protective layer covers the alignment marks 23. Actually, the manufacturing process of the source/drain may refer to the FIG. 3A and FIG. 3B.

Figure 6A:
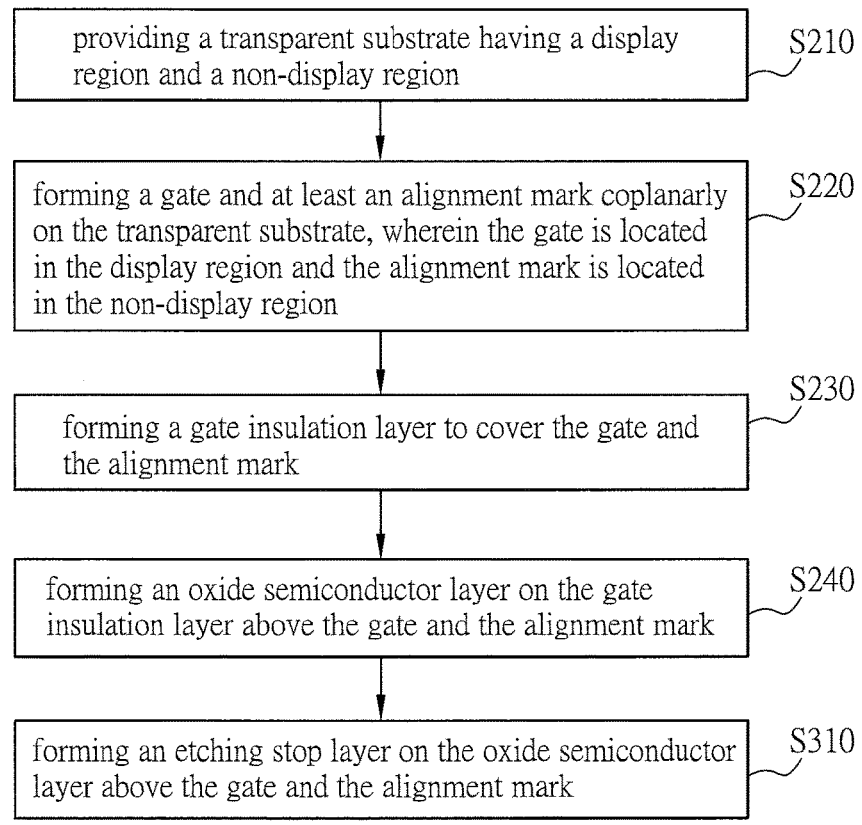
FIG. 6A is a flow chart of the steps of the method for manufacturing the semiconductor device according to the third embodiment.
Figure 6B:
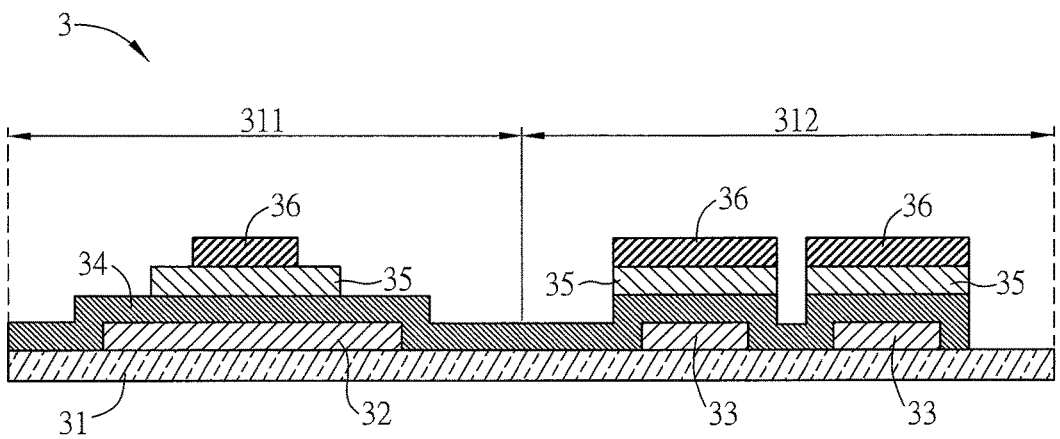
FIG. 6B is a sectional schematic diagram showing the semiconductor device according to the third embodiment.

FIG. 6A is a flow chart of the steps of the method for manufacturing the semiconductor device according to the third embodiment, and FIG. 6B is a sectional schematic diagram showing the semiconductor device according to the third embodiment. Referring to FIG. 6A and FIG. 6B, the difference between this embodiment and the second embodiment is that the method further comprises the step of: forming an etching stop layer on the oxide semiconductor layer above the gate and the alignment mark (S310) after the step S240. In this embodiment, the semiconductor device 3 comprises a transparent substrate 31, a gate 32, at least an alignment mark 33, a gate insulation layer 34, an oxide semiconductor layer 35, and an etching stop layer 36.

Figure 2A:
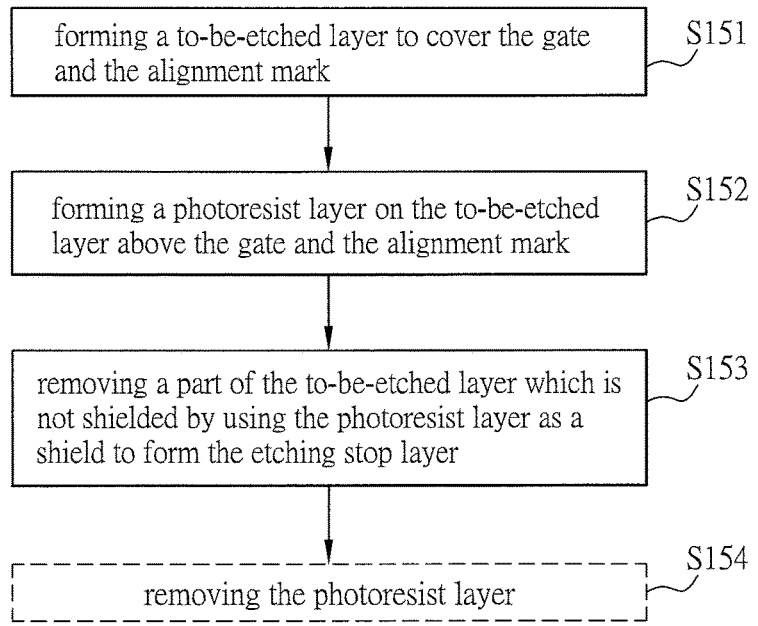
FIG. 2A is a flow chart of the steps of forming the etching stop layer.
Figure 2B:
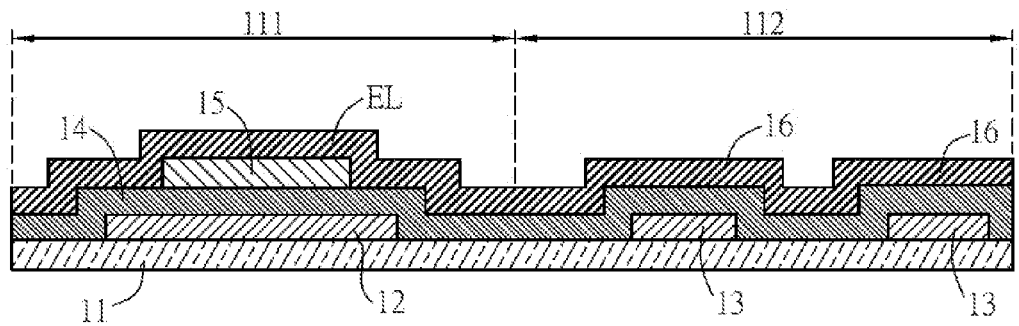
FIGS. 2B to 2D are schematic diagrams showing the manufacturing process of the etching stop layer.
Figure 2C:
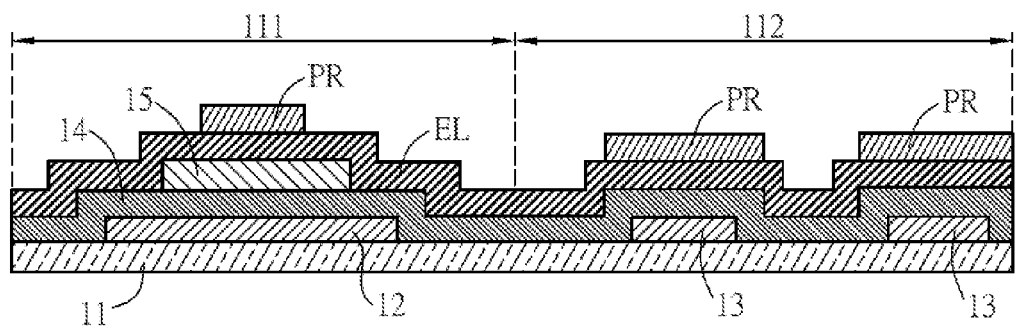
Figure 2D:
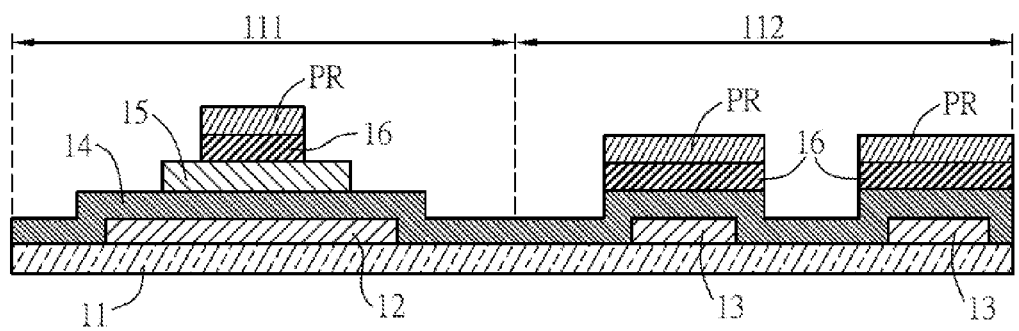

In the step S310, for example, as shown in FIG. 2A, the to-be-etched layer is formed on the gate insulation layer 34 to cover the gate 32 and cover the alignment marks 33. Then, a photoresist layer is formed on the to-be-etched layer above the gate 32 in the display region 311 and above the alignment marks 33 in the non-display region 312. Finally, the portion of the to-be-etched layer which is not shielded by the photoresist layer is removed, and the remaining portion of the to-be-etched layer which is shielded by the photoresist layer is serving as a shield to form the etching stop layer 36. Thus, the disposition of the gate insulation layer 34, the oxide semiconductor layer 35 and the etching stop layer 36 above the alignment marks 33 may contribute to preventing the alignment marks 33 from being removed due to the etching process and alignment can be retained in the following manufacturing process of the source/drain.

Figure 7:
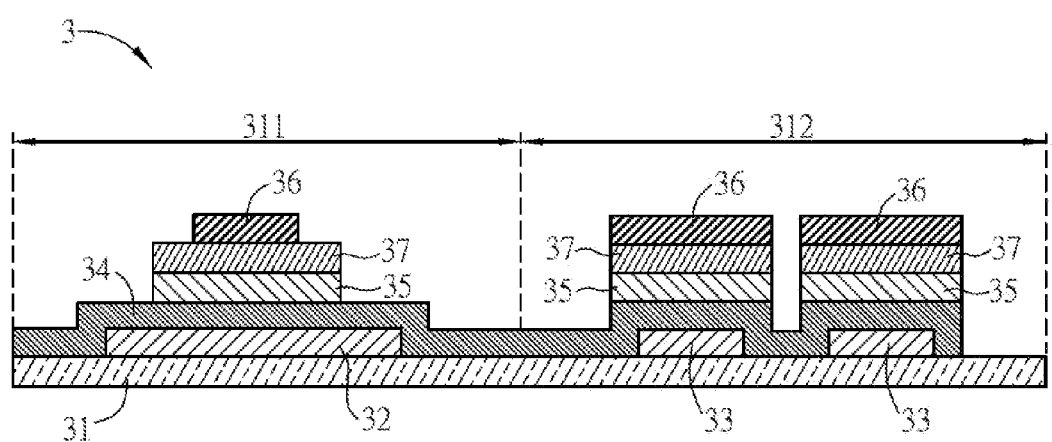
FIG. 7 is a sectional schematic diagram showing the semiconductor device according to the fourth embodiment.

Moreover, the semiconductor device 3 may further comprise a buffer layer. Referring to FIG. 7, it is a sectional schematic diagram showing the semiconductor device according to the fourth embodiment. In the embodiment, the buffer layer 37 is formed on the oxide semiconductor layer 35 above the gate 32 and the alignment marks 33. For example, the buffer layer 37 may be an aluminum oxide ($AlO_x$) film and its alloy. Moreover, some elements which can improve heat resistance may be added into the aluminum oxide ($AlO_x$) film, and the element may comprise Nd, Y, Fe, Ti, V, Zr, Nb, Mo, Hf, Ta, Mg, Cr, Mn, Ru, Rh, Pd, Ir, Pt, La, Gd, Tb, Dy, Sr, Sm, Ge, Bi, or a combination thereof.

The semiconductor device 3 may further comprise a source/drain, a protective layer, or a conductive layer to form the transistor and the pixel electrode. Actually, the manufacturing process of the source/drain may refer to FIG. 3A and FIG. 3B.

In summary, the semiconductor device and its manufacturing method according to the disclosure are to form the etching stop layer or the oxide semiconductor layer on the alignment mark, so the alignment mark will not be removed due to the etching process, and its alignment can be retained in the following manufacturing processes.

Although the invention has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the invention.

What is claimed is:

1. A method for manufacturing a semiconductor device, comprising:
   providing a transparent substrate having a display region and an non-display region;
   forming a gate and at least an alignment mark coplanarly on the transparent substrate, wherein the gate is located in the display region and the alignment mark is located in the non-display region;
   forming a gate insulation layer to cover the gate and cover the alignment mark and prevent the alignment mark from being etched;
   forming an oxide semiconductor layer on the gate insulation layer and above the gate; and
   forming an etching stop layer above the gate and the alignment mark to cover the alignment mark and prevent the alignment mark from being etched.

2. The method of claim 1, wherein a step of forming the etching stop layer comprises:
   forming a to-be-etched layer to cover the gate and cover the alignment mark;
   forming a photoresist layer on the to-be-etched layer above the gate and the alignment mark; and
   removing the portion of the to-be-etched layer which is not shielded by the photoresist layer, and the remaining portion of the to-be-etched layer which is shielded by the photoresist layer is serving as a shield to form the etching stop layer.

3. The method of claim 1, further comprising:
   forming a source/drain;
   forming a protective layer to cover at least a part of the source/drain; and forming a conductive layer to be electrically connected to the source/drain.

4. The method of claim 3, wherein the protective layer extends to cover the alignment mark in the step of forming the protective layer.

5. A method for manufacturing a semiconductor device, comprising:
providing a transparent substrate having a display region and a non-display region;
forming a gate and at least an alignment mark coplanarly on the transparent substrate, wherein the gate is located in the display region and the alignment mark is located in the non-display region;
forming a gate insulation layer to cover the gate and cover the alignment mark and prevent the alignment mark from being etched; and
forming an oxide semiconductor layer on the gate insulation layer and above the gate and the alignment mark to cover the alignment mark and prevent the alignment mark from being etched.

6. The method of claim 5, further comprising:
forming an etching stop layer on the oxide semiconductor layer and above the gate and the alignment mark to cover the alignment mark.

7. The method of claim 5, further comprising:
forming a buffer layer on the oxide semiconductor layer and above the gate and the alignment mark to cover the alignment mark.

8. The method of claim 6, wherein the step of forming the etching stop layer comprises:
forming a to-be-etched layer to cover the gate and cover the alignment mark;
forming a photoresist layer on the to-be-etched layer above the gate and the alignment mark; and
removing the portion of the to-be-etched layer which is not shielded by the photoresist layer, and the remaining portion of the to-be-etched layer which is shielded by the photoresist layer is serving as a shield to form the etching stop layer.

9. The method of claim 6, further comprising:
forming a source/drain;
forming a protective layer to cover at least a part of the source/drain; and
forming a conductive layer to be electrically connected to the source/drain.

10. The method of claim 9, wherein the protective layer extends to cover the alignment mark in the step of forming the protective layer.

11. A semiconductor device, comprising:
a transparent substrate having a display region and a non-display region;
a gate formed on the transparent substrate and located in the display region;
at least an alignment mark formed on the transparent substrate and coplanar with the gate in the non-display region;
a gate insulation layer covering the gate and the alignment mark to prevent the alignment mark from being etched; and
an oxide semiconductor layer formed on the gate insulation layer and above the gate and the alignment mark to cover the alignment mark and prevent the alignment mark from being etched.

12. The semiconductor device of claim 11, further comprising:
an etching stop layer formed on the oxide semiconductor layer and above the gate and the alignment mark to cover the alignment mark.

13. The semiconductor device of claim 11, further comprising:
a protective layer covering the alignment mark.

14. The semiconductor device of claim 11, further comprising:
a buffer layer formed on the oxide semiconductor layer and above the gate and the alignment mark to cover the alignment mark.

15. The semiconductor device of claim 11, wherein the material of the oxide semiconductor layer comprises indium gallium zinc oxide (IGZO) or amorphous silicon (a-Si).

16. The semiconductor device of claim 11, wherein the material of the conductive layer comprises indium tin oxide (ITO), indium zinc oxide (IZO), aluminum doped zinc oxide (AZO), fluorine doped tin oxide (FTO), gallium doped zinc oxide (GZO), or a combination thereof.

* * * * *